United States Patent
Noll et al.

(10) Patent No.: US 12,494,114 B2
(45) Date of Patent: Dec. 9, 2025

(54) ENCODING DEVICE AND ENCODING METHOD FOR MULTICHANNEL ENCODING OF VIBROTACTILE SIGNALS AND DECODING AND DECODING METHOD

(71) Applicant: Technische Universität München, Munich (DE)

(72) Inventors: Andreas Noll, Munich (DE); Lars Andreas Nockenberg, Munich (DE); Eckehard Steinbach, Munich (DE)

(73) Assignee: Technische Universität München, Munich (DE)

( * ) Notice: Subject to any disclaimer, the term of this patent is extended or adjusted under 35 U.S.C. 154(b) by 216 days.

(21) Appl. No.: 18/348,488

(22) Filed: Jul. 7, 2023

(65) Prior Publication Data

US 2024/0013636 A1 Jan. 11, 2024

(30) Foreign Application Priority Data

Jul. 7, 2022 (EP) ..................... 22183643

(51) Int. Cl.
*H03M 7/30* (2006.01)
*G08B 6/00* (2006.01)

(52) U.S. Cl.
CPC ..................... *G08B 6/00* (2013.01)

(58) Field of Classification Search
CPC ........ G08B 6/00; G06F 3/016; H03M 7/3077; G10L 19/008; G10L 19/038
(Continued)

(56) References Cited

U.S. PATENT DOCUMENTS 7,965,206 B2 * 6/2011 Choo ................. H03M 7/4006
 341/106
11,769,513 B2 * 9/2023 Niedermeier ....... G10L 19/0212
 704/500

FOREIGN PATENT DOCUMENTS

| DE | 103 28 777 A1 | 1/2005 |
| DE | 10 2019 204 527 A1 | 10/2020 |
| EP | 0768780 B1 | 5/2003 |

OTHER PUBLICATIONS

"Clustering (K-Mean and Hierarchical) with Practical Implementation",Amir Ali; Wavy AI Research Foundation Feb. 10, 2019 (Feb. 10, 2019), URL:https://medium.com/machine-learning-researcher/clustering-k-mean-and-hierarchical-cluster-fa2de08b4a4b.

* cited by examiner

*Primary Examiner* — Jean B Jeanglaude
(74) *Attorney, Agent, or Firm* — Maginot, Moore & Beck, LLP

(57) ABSTRACT

Encoding device for encoding vibrotactile multichannel signals, includes an encoder input module configured to receive a multichannel signal; a transform module adapted to execute a discrete wavelet transform of each channel of the multichannel signal and to generate a respective frequency range representation of each channel; a psychohaptic model unit designed to allocate to each channel, based on the respective frequency range representation, a mathematical representation of human perception of the channel; a clustering module configured to group, based on the allocated mathematical representation and a similarity measure of the channels, the wavelet-transformed channels of each multichannel signal into clusters, wherein each cluster is allocated a reference channel; a reference encoding module designed to quantize and compress wavelet coefficients of the refer- (Continued)

ence channels which result from the performed discrete wavelet transform of the reference channels; a differential encoding module configured to encode the channels within a cluster, which are not a reference channel, in relation to the reference channel or at least one other channel of the cluster; and an encoder output module which outputs the clustered, compressed channels of each multichannel signal as a bit stream.

16 Claims, 8 Drawing Sheets

(58) Field of Classification Search
USPC .............................................. 341/87, 50, 51
See application file for complete search history.

ENCODING DEVICE AND ENCODING METHOD FOR MULTICHANNEL ENCODING OF VIBROTACTILE SIGNALS AND DECODING AND DECODING METHOD

This application claims priority to European application 22183643.0, having a filing date of Jul. 7, 2022, the entire disclosure of which is incorporated herein by reference.

TECHNICAL FIELD OF THE INVENTION

The present invention relates to an encoding device for encoding vibrotactile signals and to a decoding device. The present invention also relates to a method of encoding vibrotactile signals and to a decoding method.

BACKGROUND OF THE INVENTION

The encoding and decoding of haptic signals, and in particular tactile signals, is a field of research which offers diverse applications, from virtual reality or augmented reality to the Internet of Things. What is challenging for all of these applications is efficient and reliable transmission of tactile perceptions.

In contrast to optical or acoustic signals, tactile signals are sensed as vibrations. Therefore, time evolution is a relevant variable. As a result, the encoding of vibrotactile signals is performed differently than e.g. the encoding of images with a JPEG encoder or music with an MPEG encoder.

The amount of data generated with vibrotactile signals is often too large to perform efficient encoding. Some methods are known in the prior art for effectively reducing the amount of data prior to the encoding.

DE 10 2019 204 527 B4 introduced an encoding and decoding device, together with an encoding and decoding method, in order to achieve efficient pre-processing of the amount of data. The basic concept is to be based on the use of a psychohaptic model, whereby the signal parts which are most important for human perception are to be kept, while signal parts which are not easily felt by humans are to be removed.

The concepts in DE 10 2019 204 527 B4 apply to signals with one channel per signal. However, it is advantageous to manage more than one channel per signal in order to obtain more vibrotactile information.

SUMMARY OF THE INVENTION

It is the object of the present invention to provide a device and method which efficiently perform encoding and compression of multichannel vibrotactile signals, wherein a reduction in the data rate is effected with minimal loss of relevant perceptual information. In addition, the encoding device and encoding method meet the requirements of perception-related transparency, modularity and versatility. It is a further object of the invention to provide a decoding device and a decoding method which are suitable for decompressing multichannel vibrotactile signals.

According to a first aspect of the invention, an encoding device for encoding vibrotactile multichannel signals comprises an encoder input module which is configured to receive a multichannel signal; a transform module which is adapted to execute in each case a discrete wavelet transform of each channel of the multichannel signal and to generate a respective frequency range representation of each channel; a psychohaptic model unit which is designed to allocate to each channel, based on the respective frequency range representation, a mathematical representation of human perception of the channel; a clustering module which is configured to group, based on the allocated mathematical representation of human perception of each channel and a similarity measure of the channels, the wavelet-transformed channels of each multichannel signal into clusters, wherein each cluster is allocated a reference channel; a reference encoding module which is designed to quantize and compress wavelet coefficients of the reference channels which result from the performed discrete wavelet transform of the reference channels; a differential encoding module which is configured to encode the channels within a cluster, which are not a reference channel, in relation to the reference channel or at least one other channel of the cluster; and an encoder output module which outputs the clustered, compressed channels of each multichannel signal as a bit stream. In a preferred embodiment, the differential encoding module is configured to encode all channels within a cluster, which are not a reference channel, in relation to the reference channel.

According to a second aspect of the invention, an encoding method for encoding vibrotactile multichannel signals is provided, comprising the steps of: (a) receiving a multichannel signal; (b) executing a respective discrete wavelet transform of each channel of the multichannel signal; (c) generating a respective frequency range representation of each channel; (d) allocating, based on the frequency range representation of each channel and on a psychohaptic model, each channel to a respective mathematical representation of human perception of the channel; (e) grouping, based on the allocated mathematical representation of human perception of each channel and on a similarity measure of the channels, the wavelet-transformed channels of each multichannel signal into clusters, wherein each cluster is allocated a reference channel; (f) quantizing and encoding the wavelet coefficients of the reference channels which result from the performed discrete wavelet transform of the reference channels; (g) quantizing and differential-encoding the channels within a cluster, which are not a reference channel, in relation to the reference channel or another channel of the cluster; and (h) outputting the clustered, compressed channels of each multichannel signal as a respective bit stream. In a preferred embodiment, in step (g) all channels within a cluster, which are not a reference channel, are differential-encoded in relation to the reference channel.

According to a third aspect of the invention, a decoding device for decoding a bit stream of clustered vibrotactile multichannel signals comprises a decoder input module which is configured to receive a bit stream of clustered vibrotactile multichannel signals; a decoding module which is configured to decompress and dequantize the bit stream, further comprising a differential decoding unit which is configured to decode the clustered channels of a cluster in relation to a reference channel; a declustering module which is designed to degroup the channels within a decoded cluster and to determine wavelet coefficients based thereon; an inverse discrete wavelet transform unit which is designed to generate the original channel from the wavelet coefficients of a channel; and a decoder output module which is configured to output a decoded multichannel signal based on the decoded channels.

According to a fourth aspect of the invention, a decoding method for decoding a bit stream of clustered vibrotactile multichannel signals is provided, comprising the steps of: (a) receiving a bit stream of clustered vibrotactile multichannel signals; (b) decoding and dequantizing the bit stream, wherein, by means of differential-decoding, the clustered channels of a cluster are decoded in relation to a reference channel; (c) declustering the channels within a decoded cluster, wherein the channels are expressed as wavelet coefficients based thereon; (d) executing an inverse discrete wavelet transform, wherein the original channel is generated from the wavelet coefficients of a channel; and (e) outputting a decoded multichannel signal based on the decoded channels.

In particular, the encoding method according to the second aspect of the invention can be performed with the encoding device according to the first aspect of the invention. Therefore, the features and advantages described herein in connection with the encoding device are also applicable to the encoding method and vice versa.

In a similar manner, the decoding method according to the fourth aspect of the invention can be performed with the decoding device according to the third aspect of the invention. Therefore, the features and advantages described herein in connection with the decoding device are also applicable to the decoding method and vice versa.

According to a fifth aspect, the invention provides a computer program product which comprises an executable program code which is configured, upon execution thereof, to perform the encoding method according to the second aspect of the present invention.

According to a sixth aspect, the invention provides a computer program product which comprises an executable program code which is configured, upon execution thereof, to perform the decoding method according to the fourth aspect of the present invention.

According to a seventh aspect, the invention provides a non-volatile computer-readable data storage medium which comprises an executable program code which is configured such that, upon execution thereof, it performs the method according to the second aspect of the present invention.

According to an eighth aspect, the invention provides a non-volatile computer-readable data storage medium which comprises an executable program code which is configured such that, upon execution thereof, it performs the method according to the fourth aspect of the present invention.

The non-volatile computer-readable data storage medium can comprise or consist of any type of computer memory, in particular a semiconductor memory, such as e.g. a solid-state memory. The data storage medium can also comprise or consist of a CD, DVD, Blu-ray disc, USB memory stick, or the like.

According to a ninth aspect, the invention provides a data stream which comprises an executable program code, or is configured to generate such a program code which is configured, upon execution thereof, to perform the method according to the second aspect of the present invention.

According to a tenth aspect, the invention provides a data stream which comprises an executable program code, or is configured to generate such a program code which is configured, upon execution thereof, to perform the method according to the fourth aspect of the present invention.

A concept forming the basis of the invention is that of introducing an encoding device for multichannel vibrotactile signals, in which the different channels are clustered based on a modeling of human perception. The different clusters comprise channels which are perceptually similar. The vibrotactile information of the channels is thus arranged hierarchically, which results in the most relevant perceptual information being processed and the encoding being efficient and perceptually faithful.

The above-described encoding device advantageously permits implementation of an encoding method. In this case, the vibrotactile channel signals are initially divided into blocks and are then transformed in the frequency range and wavelet range. The channels are then clustered and divided into reference channels and secondary channels. The reference channels are encoded and the information in the secondary channels is quantized and encoded in relation to the reference channels or other channels of the same cluster.

One advantage of the present invention is that the information relevant to perception within the channels is singled out by the clustering. This contributes to the fact that the encoding of multichannel signals is performed very efficiently.

According to some embodiments of the invention, provision is made that the encoding device further comprises a block division module which is configured to divide each channel into a plurality of consecutive blocks.

According to some embodiments of the invention, provision is made that the block division module comprises a block switch unit which is configured to select the length of the blocks between a minimum value BLmin and a maximum value.

According to some embodiments of the invention, provision is made that the block division module comprises a transient recognition unit which is designed to fix the length of the blocks and to communicate this length to the block switch unit.

According to some embodiments of the invention, provision is made that the psychohaptic model unit is provided to generate the mathematical representation of human perception of a channel as a frequency-dependent function, based on a perception threshold and on a masking threshold function which is based on the frequency peaks of the channel.

According to some embodiments of the invention, provision is made that the clustering module is configured to perform the clustering of channels iteratively, wherein for each channel in a cluster there is at least one other channel in the cluster, with respect to which the similarity measure is below a predetermined threshold value.

According to some embodiments of the invention, provision is made that the similarity measure of two channels is proportional to an energy difference value of the channels.

According to some embodiments of the invention, provision is made that the energy difference value of the channels is calculated on the basis of the wavelet coefficients of the channels.

According to some embodiments of the invention, provision is made that the similarity measure of two channels is proportional to the product of the energies of the channels and/or inversely proportional to the product of the energies of the masking threshold functions of the channels. In other words, the similarity measure is proportional to the geometric average of the signal-to-masking ratio (SMR).

According to some embodiments of the invention, provision is made that the encoding device further comprises a header encoding unit which is adapted to add secondary information to the bit stream of the encoded multichannel signal.

According to some embodiments of the invention, provision is made that the encoding device further comprises a mean value encoding unit which is configured to generate a zero mean value channel from a channel by subtracting the mean value, and to transmit information regarding the mean value as secondary information to the header encoding unit. Mean values appear as zero frequency components in the frequency range, which cause the wavelet and frequency transforms to be distorted. Therefore, it is preferred to first subtract the mean values of the channels.

Although some functions are described here and also hereinafter as being executed by modules, this does not necessarily mean that these modules are provided as units which are separate from one another. In cases, in which one or a plurality of modules are provided as software, the modules can be implemented by program code sections or program code snippets which can be separate from one another, but may also be interwoven or integrated with one another.

Equally, in cases in which one or a plurality of modules are provided as hardware, the functions of one or a plurality of modules can be provided by the same hardware component, or the functions of a plurality of modules can be distributed to a plurality of hardware components which do not necessarily have to correspond to the modules. Therefore, it is to be assumed that each application, system, method, etc. which has all of the features and functions attributed to a specific module comprises or implements this module. In particular, it is possible that all modules are implemented by program code which is executed by the computing device, e.g. a server or a cloud computing platform.

The aforementioned embodiments and implementations can be combined in any way, where practical.

The further scope of applicability of the present method and device will become apparent from the following figures, detailed description and claims. It is understood, however, that the detailed description and specific examples, while indicating preferred embodiments of the invention, are for illustrative purposes only and various changes and modifications within the basic idea and scope of the invention will be apparent to persons skilled in the art.

BRIEF DESCRIPTION OF THE DRAWINGS

The invention will be described hereinafter with respect to the advantageous embodiments thereof with reference to the following drawings. These drawings, in which like reference numerals designate identical or functionally similar elements in the individual views, are incorporated into and form a part of the disclosure together with the detailed description hereinafter. They serve to further illustrate embodiments of concepts which include the claimed invention, and to explain various principles and advantages of these embodiments. Elements depicted in the drawings are not necessarily illustrated to scale. This serves to disclose with clarity the fundamentals and principles of the invention.

In the drawings.

In some cases, known structures and apparatuses are illustrated in the form of block diagrams so as not to obscure the concepts of the present invention. The numbering of the steps in the methods is also intended to facilitate the description thereof. They do not necessarily imply a specific sequence of the steps. In particular, several steps can be performed simultaneously.

DESCRIPTION OF THE DRAWINGS

The detailed description of the preceding listed drawings contains specific details in order to enable a comprehensive understanding of the present invention. However, it will be clear to a person skilled in the art that the present invention can also be carried out without these specific details.

Figure 1:
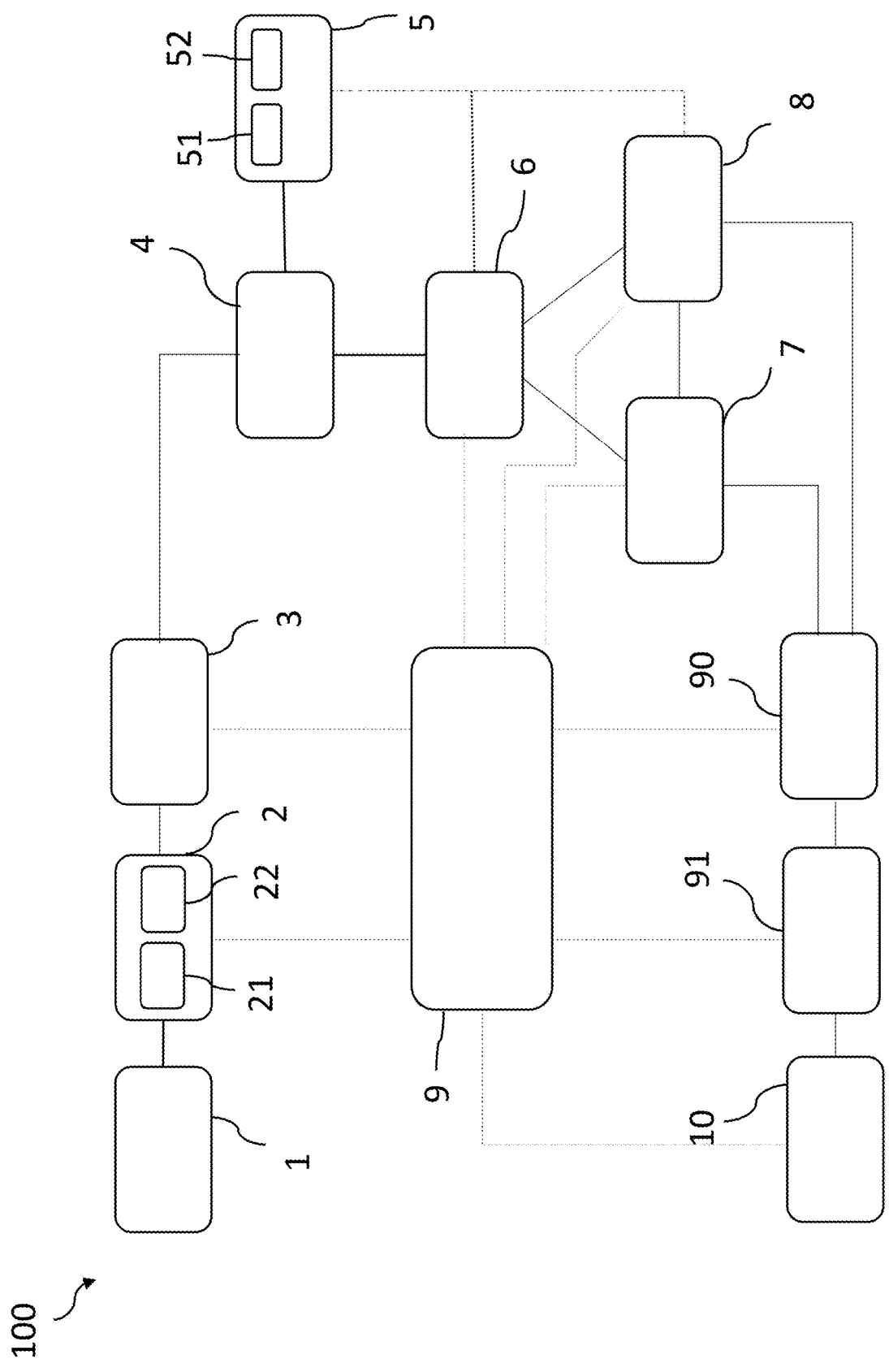
FIG. 1 shows an encoding device according to one embodiment of the invention.

FIG. 1 shows an encoding device 100 according to one embodiment of the invention. The various components and functions are illustrated indistinctly as blocks. The spatial arrangement of the blocks in FIG. 1 is only an illustration.

Depending upon their performance functions, the blocks in FIG. 1 can be grouped in three different levels. As shown in FIG. 1, the encoding device 100 comprises an encoder-input module 1, a block division module 2 and an mean value encoding unit 3 which are associated with a pre-processing level. The encoder-input module 1 is configured to receive vibrotactile multichannel signals e.g. from a touch sensor. The vibrotactile signals are generated at one or a plurality of sampled frequencies, wherein a plurality of channels are available for each sampling signal. The block division module 2 is configured to divide each channel into a multiplicity of consecutive blocks. The division of the signals serves to ensure that they can be processed more easily.

According to some preferred embodiments, provision is made that the block division module 2 further comprises a block switch unit 21 which fixes the length of the blocks between a minimum value BLmin and a maximum value BLmax. In some embodiments, provision is made to establish the length of the blocks dynamically by means of a transient recognition unit 22. The block division module 2 is described in detail by reference to FIG. 2.

The means value encoding unit 3 serves to set the mean value of a signal to zero. In general, signals do not have a zero mean value which results in a significant zero frequency component if the signal is illustrated in the frequency range. A mean value component not equal to zero is problematic particularly in the case of discrete wavelet transforms because it can result in wavelet coefficients being unbalanced. As described hereinafter, the quantization of the wavelet coefficients scales with the maximum wavelet coefficient. Therefore, a high zero-frequency coefficient can result in the quantization scale being much coarser than desired.

In order to avoid this problem, there are at least two options. The first one is to subtract the means value of each signal before it passes to the codec. This is particularly suitable for encoding procedures which cannot indicate a zero-frequency component. However, there are also cases in which the mean value cannot be subtracted. The mean value encoding unit 3 is designed to subtract the signal mean value for each signal and perform quantization such that each signal can be encoded as a zero mean value signal. The information regarding the signal mean value is stored and finally encoded with the signal as secondary information.

The mean value of a channel signal si is to be determined by $$\overline{s}_i = \frac{1}{L_{block}} \sum_{n=0}^{L_{block}-1} s_i[n],$$

wherein si[n] is the channel signal in the block i. The maximum mean value of all channels is then quantized, i.e.

$$\overline{s}_{max,q} = Q\left(\max_{i \in j} \overline{s}_i\right)$$

Then, the mean values of each channel are standardized with the quantized maximum mean value and are then quantized:

$$\overline{s}_{i,q} = Q\left(\frac{\overline{s}_i}{\overline{s}_{max,q}}\right)$$

The subtracted signals in the block i are then determined as follows:

$$s'_i[n] = s_i[n] - \overline{s}_{i,q} \cdot \overline{s}_{max,q}.$$

The mean values of each channel are thus approximately zero.

The encoding device 100 further comprises a transform module 4, a psychohaptic model unit 5, a clustering module 6, a reference encoding module 7 and a differential encoding module 8.

The transform module 4 is configured to perform two transforms of each channel: to generate a discrete wavelet transform (DWT) and a frequency range representation, in particular by means of a discrete cosine transform (DCT). The DWT illustrates the sampling signals as a series of wavelet coefficients.

The psychohaptic model unit 5 is designed to allocate to each channel a mathematical representation of human, haptic, in particular tactile, perception of the channel based upon the respective frequency range representation. In other words, the psychohaptic model unit 5 assesses each signal as a human perception signal based upon a perception model. The touch sensation perceived by a human is frequency-dependent and amplitude-dependent. Therefore, the information of the frequency range representation is particularly relevant for the model. In other words, the psychohaptic model unit 5 aims for information loss to occur where it is least perceptible. The psychohaptic model unit 5 is provided to comprise a model provisioning unit 51 and/or a magnitude extraction unit 52.

The model provisioning unit 51 includes a peak extraction subunit, a masking threshold calculation subunit, a perception threshold subunit, and a performance-additive combination subunit. The peak extraction subunit is configured in such a manner that peaks, i.e. peaks on the basis of the extracted magnitude of the signal are identified by identifying peaks which have a specific protuberance and height. Each peak corresponds to a frequency $f_p$ and an order of magnitude $a_p$. The psychohaptic model unit consists of a memory (not illustrated) which stores the frequency $f_p$ and magnitudes $a_p$ of each identified peak.

The masking threshold calculation subunit is configured in such a manner that it calculates a masking threshold for the peaks at various frequencies f based upon the frequency $f_p$ and the magnitudes $a_p$ of each peak and on a sampling frequency $f_s$ of the signal. The masking thresholds $m_p(f)$ at various frequencies f for each peak are calculated with the following equation:

$$m_p(f) = a_p - 5 \text{ dB} + 5 \text{ dB}\frac{2f_p}{f_s} - \frac{30 \text{ dB}}{f_p^2}(f - f_p)^2$$

The perception threshold subunit is configured in such a manner that it calculates an absolute perception threshold at different frequencies (due to the fact that humans perceive signals at different frequencies in a different way) which corresponds to a signal magnitude, in particular an average signal magnitude, which humans need at a specific frequency to be able to perceive a signal. The absolute perception thresholds t(f) at different frequencies f are calculated with the following equation:

$$t(f) = \left| \frac{62 \text{ dB}}{\left(\log_{10}\left(\frac{6}{11}\right)\right)^2} \left[\log_{10}\left(\frac{f}{550 \text{ Hz}} + \frac{6}{11}\right)\right]^2 \right| - 77 \text{ dB}.$$

The magnitude extraction unit 52 is configured to extract the amplitude of the signal after performing the DCT and illustrating the result in dB.

The psychohaptic model describes how the theoretical frequency-dependent sensation amplitude threshold value is modified as a function of the input frequency spectrum into a modified frequency-dependent amplitude threshold value which represents the amplitudes at a specific frequency which is really needed to cause sensation at each frequency for the respective input signal considered.

The performance-additive combination subunit is configured to calculate a global masking threshold value, based upon the absolute perception threshold value t(f) and the masking threshold $m_p(f)$.

The clustering module 6 is configured to cluster the channels within a multichannel signal which are similar, i.e. the information thereof is correlated. This serves to achieve efficient encoding of a multichannel signal by grouping the channels with redundant information in clusters. In accordance with the invention, the similarity criteria are based upon a metric, in particular upon a perception-sensitive metric, which is defined with the energies of the wavelet-transformed signals $$E_i := \sum_{n=0}^{L_{block}-1} w_i^2[n].$$

This metric defines a distance or similarity between two channels i and j in the wavelet band b as $$g_{i,j,b} := \frac{E_{i,j,b}^{diff}}{E_{j,b}}$$

wherein $$E_{i,j}^{diff} := \sum_{n=0}^{L_{block}-1} (w_i[n] - w_j[n])^2.$$

The perception-sensitive metric is defined as a weighted mean value, specifically $$g_{i,j} = \frac{1}{\sum_{j=1}^{B} a_b} \sum_{b=1}^{B} a_b g_{i,j,b}.$$

wherein the weight ab $$a_b = \sqrt{SMR_{i,b} \cdot SMR_{j,b}},$$

is the geometric average value of the signal-to-masking ratio (SMR).

If two channels of various clusters are compared, it is possible to establish whether their deviations are below a threshold value. If this is the case, their clusters are combined.

The clustering module 6 is further configured to allocate a reference channel to each cluster. It is also possible to determine which other channel of the same cluster is used as a reference in order to encode a channel, which is not the reference channel of the cluster, in differential encoding module 8. An example of an arrangement of channels in clusters is described in FIG. 5. The clustering of channels on the basis of the metric can be implemented as an iterative method. This clustering method is described by reference to FIG. 4.

The reference encoding module 7 and the differential encoding module 8 are designed to perform the encoding of all signal channels within a cluster.

The reference encoding module 7 takes the wavelet coefficients w of the reference channel of a cluster and quantizes them. The quantization is effected e.g. using an embedded uniform quantizer, wherein separate quantization of each wavelet band is performed. Within a wavelet band, the maximum wavelet coefficients $w_{max}$ are identified and quantized as $\hat{w}_{max}$. Therefore, with b available bits the quantization step length is established as $$\Delta = \frac{\hat{w}_{max}}{2^b}.$$

The quantization of the remaining wavelet coefficients is then effected according to $$\hat{w} = \text{sgn}(w) \left\lfloor \frac{w}{\Delta} \right\rfloor.$$

Each wavelet band is iteratively allocated a bit number from a predetermined bit budget. In some embodiments, provision is made after each iteration to arrange a bit with respect to the wavelet band having the lowest resolution. The resolution can be calculated e.g. with the masking-to-noise ratio (MNR).

The differential encoding module 8 is designed to encode the channels within a cluster (except for the reference channel) in relation to the reference channel. This is effected in accordance with the invention with differential encoding. The wavelet coefficients of each channel are reduced by the quantized wavelet coefficient of the reference channel, i.e.

$$w_{res,i} = w_i - \hat{w}_i,$$

The reduced wavelet coefficient is then quantized with an embedded uniform quantizer (see FIG. 6), optimally with the embedded uniform quantizer of the reference encoding module 8.

The allocated bit number of a wavelet band is heuristically based. Unlike the encoding of the reference channel, the SMR is not a good benchmark in this case. After each iteration, a wavelet band receives a separate predetermined bit budget. Since the reduced wavelet coefficients are very small, the inventors model the distribution of the bit budget with $$\text{bits}_{i,b} = \text{bits}_{mean,i} + \frac{1}{2} \log_2 \left( \frac{\sigma_{i,b}^2}{\sqrt[B]{\prod_{n=1}^{B} \sigma_{i,n}^2}} \right)$$

wherein $$\text{bits}_{mean,i} = \frac{N_{bits}}{B} - \log_2 \left( \frac{E_i}{E_{res,i}} \right)$$

and $$E_{res,i} := \sum_{n=0}^{L_{block}-1} w_{res,i}^2[n].$$

The transform module 4, the psychohaptic model unit 5, the clustering module 6, the reference encoding module 7 and the differential encoding module 8 are the components of the lossy encoding level of the encoding device 100.

The encoding device 100 further comprises a loss-free encoding level. Components thereof are loss-free encoding, such as e.g. with a set-partitioning-in-hierarchical-trees (SPIHT) algorithm 90, preferably together with an arithmetic coder (AC) 91. The SPIHT 90 and the AC 91 compress the reference channels encoded in the reference encoding module 7 and the secondary channels encoded in the differential encoding module 8.

The encoding device 100 comprises a header encoding unit 9 which is provided to add an initial block in addition to the bit stream of the encoded signal, with additional information and/or secondary information. This secondary information comprises the number of channels and block-specific information. The block-specific information comprises the length of the blocks, details regarding the discrete wavelet transform, transmitted information from the mean value encoding unit 3 (e.g. the quantized maximum means value of the signal and the other quantized values) and/or information regarding the clustering.

The information regarding the clustering is provided in two steps. In a first step, the clusters are listed according to decreasing magnitude and the channels of each cluster are identified. How the information is precisely encoded can be better explained using an example. As an example, there are 8 channels. The encoding sequence 01101010 would then describe e.g. a cluster (the largest cluster) having the channels (2, 3, 5, 7). The active channels are thus denoted by a 1 and the inactive channels (1), (4), (6), (8) are denoted by a 0. The second largest cluster is associated with the channels (1, 8) which are described by 1001 amongst the previously remaining channels (1), (4), (6), (8). The other channels (4), (6) are not clustered. They are noted by a 0 per channel. In a second step, the reference channels and the corresponding hierarchy of the channels are to be noted. For example, the cluster (2, 3, 5, 7) is renamed as (1, 2, 3, 4). The reference channels are to be placed with binary numbers at the place of the secondary channels. If 4 was the reference channel of 1, then 100 would be introduced in the first place etc.

The encoder output module 10 is adapted to output clustered, compressed channels of each multichannel signal as a bit stream. The bit stream is a multiplexing bit stream which comprises the secondary information, which is output by the header encoding unit 9, together with the bit stream of the encoded signal.

Figure 2:
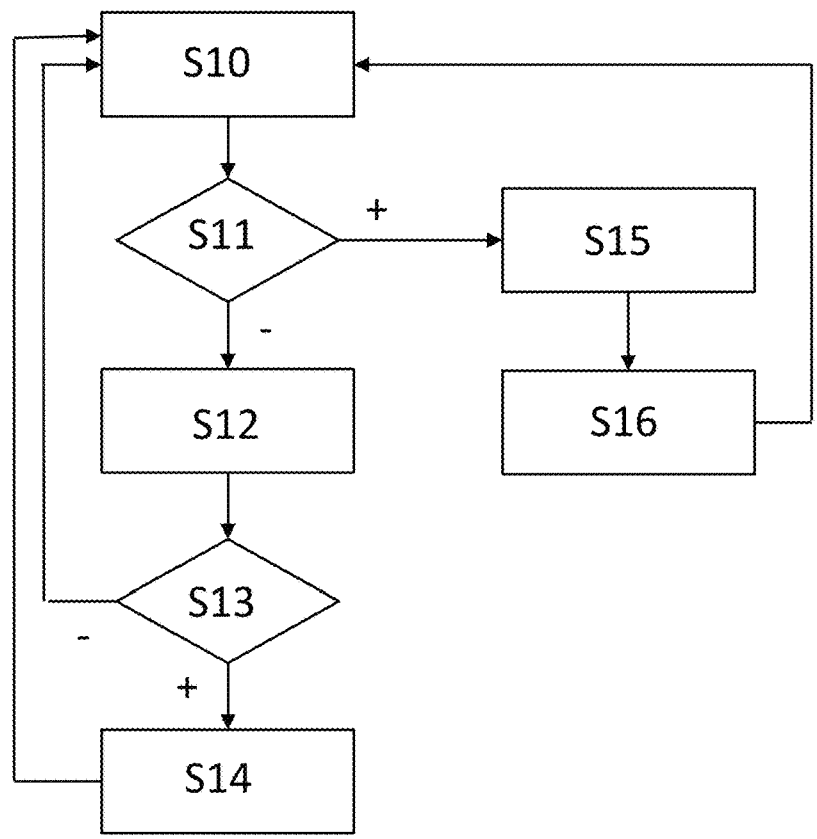
FIG. 2 shows a schematic view of the sequence of the algorithm of a block switch unit 21 according to one embodiment of the invention.

FIG. 2 shows a schematic view of the sequence of the algorithm of a block switch unit 21 in connection with a transient recognition unit 22 according to one embodiment of the invention. As already explained in the foregoing, the signals are subdivided into blocks after being received. Blocks which are short lead to a limited compression ratio. Blocks which, in contrast, are long can contain transient signals which lead, inter alia, to a pre-echo effect. Ideally, the length of the blocks should only be restricted if transient signals appeared.

In one step S10, a block having a predetermined minimum length BLmin is received. In a further step S11, transient signals are sought. This step can be performed e.g. with a transient recognition unit. If no transient signal is detected (– symbol in FIG. 2), then in another step S12 the block is stored in a buffer. In a further step S13, it is determined whether the block in the buffer has reached the length BLmax. In the first iteration, the response is negative and the algorithm returns to step S10, wherein a new block is taken by BLmin and inspected in step S11. As long as no transient signal is present, this method is repeated, whereby blocks of BLmin are placed next to one another in the buffer.

If, in step S13, the buffer contains a block with BLmax, then in step S14 the entire block with the length BLmax is sent for encoding, the buffer is emptied and updated. The method then starts anew with a new block with BLmin.

If, in step S11, a transient signal is recognized (+ symbol in FIG. 2), then in a further step S15 the blocks which are already in the buffer are sent for encoding as an individual block (with a length less than BLmax). The buffer is emptied and updated. In a further step S16, the block with the transient signal is sent for encoding.

Figure 3:
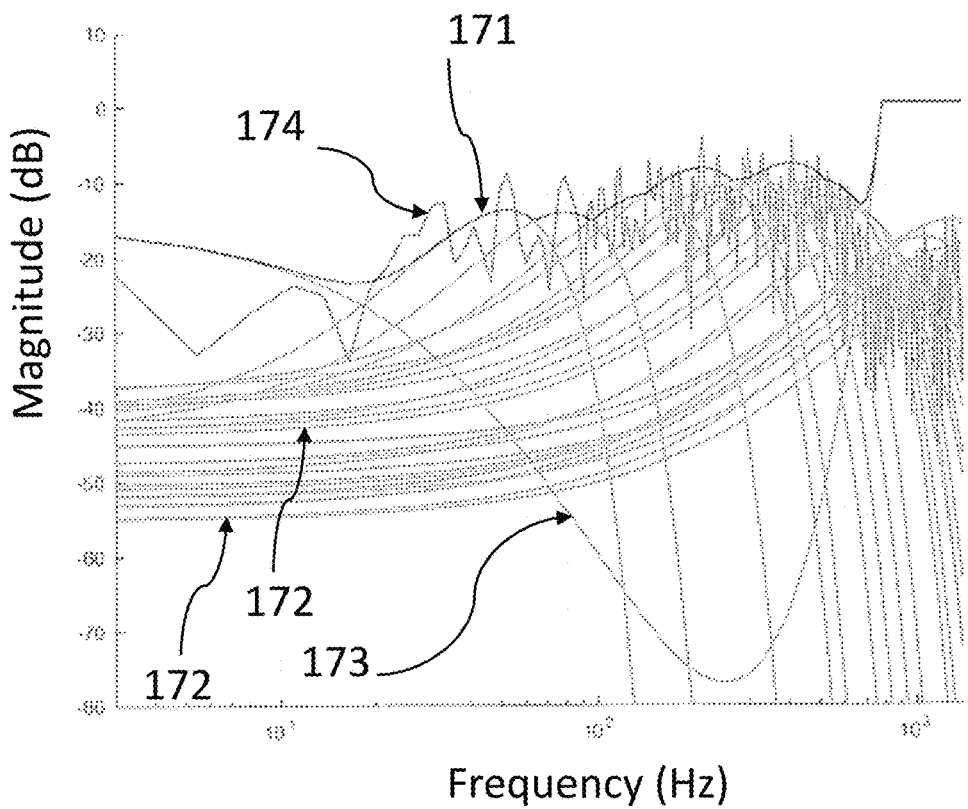
FIG. 3 shows a schematic diagram which illustrates the magnitude spectrum of an example block, the calculated masking thresholds, the calculated absolute perception threshold and the resulting global masking threshold.

FIG. 3 shows a schematic diagram which shows the magnitude spectrum of an example block of a signal channel (illustrated with the line 174). The horizontal coordinate axis designates the frequency in Hz and the vertical coordinate axis designates the magnitude in dB. FIG. 3 also illustrates the calculated masking thresholds (illustrated with the lines 172), the calculated absolute perception threshold (illustrated with the line 173) and the resulting global masking threshold (illustrated with the line 171) which is determined from the logarithmic addition of the maximum value of the masking thresholds and the absolute perception threshold.

Figure 4:
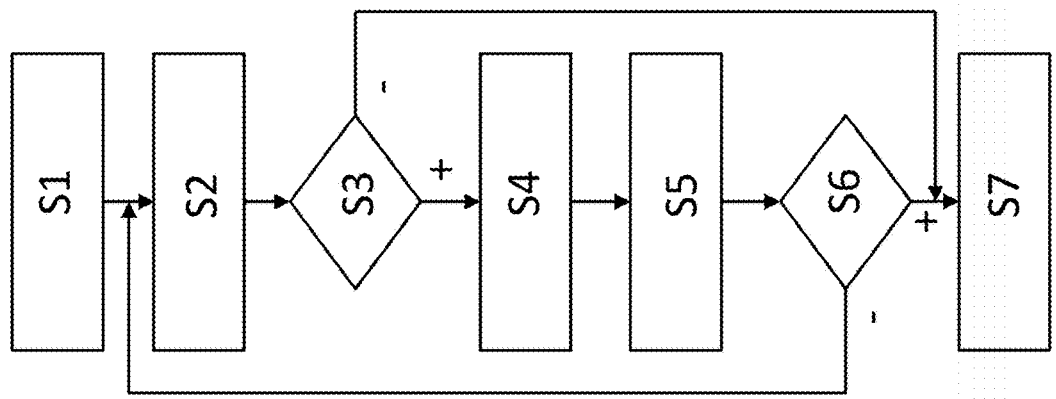
FIG. 4 shows a flow diagram of the clustering algorithm according to one embodiment of the invention.

FIG. 4 shows a flow diagram of the clustering algorithm according to one embodiment of the invention. As a first step S1, the similarity measure between two channels, preferably the perception metric, is calculated for all possible combinations of two channels. In a further step S2, the minimum value of all distances calculated with the metric is determined. As an example, two channels are described. Then, in a step S3 this minimum value is compared to a predetermined threshold value of the metric. If the minimum value is greater than the threshold value (– symbol in FIG. 4), then the channels are not similar enough and no clustering is effected. The channels are then to be encoded as individual channels. In a further step S7, the channels are sent to the reference encoding module 7.

If the minimum value is less than the threshold value (+ symbol in FIG. 4), then M1 and M2 are clustered together in a further step S4. In a further step S5, one of the channels, e.g. channel M1, is denoted as a reference channel. The selection of the reference channels can be effected e.g. randomly. The channel M2 is denoted as a residual channel. The channel M2 should no longer be compared to other channels, only the channel M1 which acts as a reference channel of the cluster. Therefore, the distance of the channel M2 to all channels outside the cluster is implemented infinitely. In a further step S6, the algorithm verifies whether all channels are clustered. If there were only the two channels M1 and M2, then all channels would already be clustered. In this case, the channels are ready to be encoded. In a step S7, the clustered channels are sent to the reference encoding module. If there were more than two channels, e.g. M1, M2, M3 and M4, then the algorithm would again start at step S1 to assess the distance between the channels. In this second iteration, only the distances between M1, M3 and M4 are calculated. In step S2, the new minimum value of the distances is determined. Then, in a step S3 this minimum value is compared to the predetermined threshold value of the metric, etc. The channels are grouped in clusters at the end of the algorithm, wherein all the channels within a cluster maintain a distance from their reference channels which is less than the threshold value.

Figure 5:
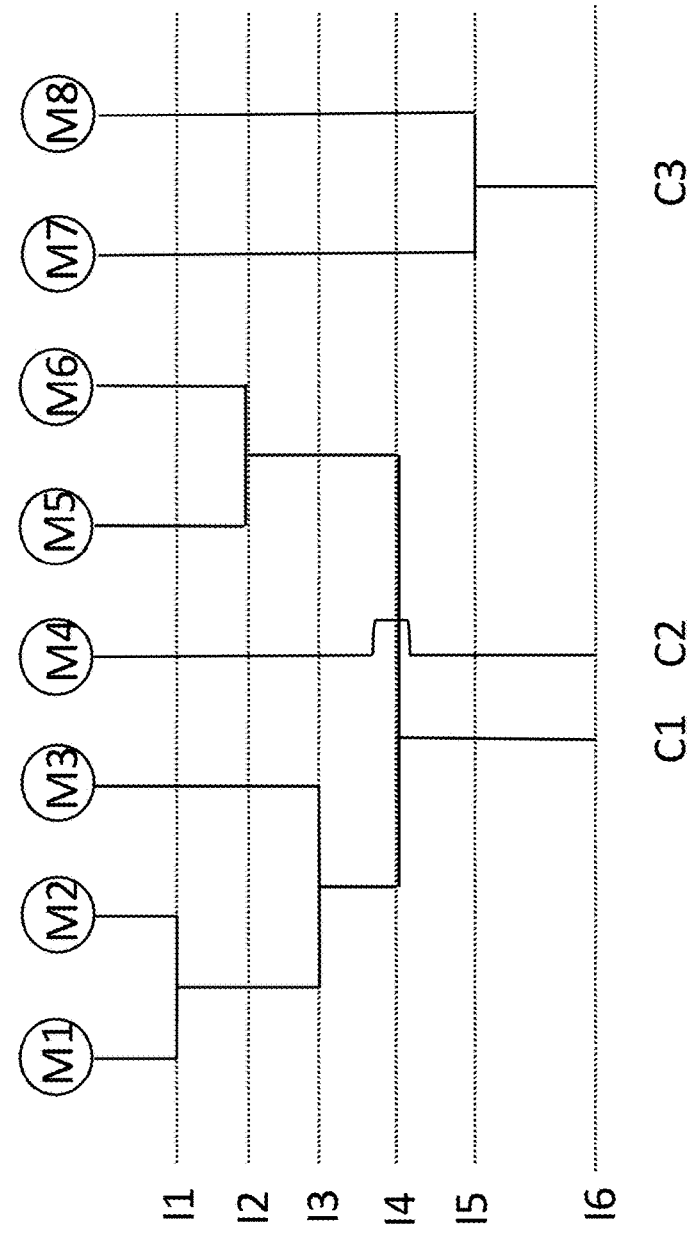
FIG. 5 shows an exemplary tree structure after application of the clustering algorithm which implements the clustering module in order to group the channels.

FIG. 5 shows an exemplary tree structure after application of the clustering algorithm which implements the clustering module 6 in order to group the channels. In this example, there are eight channels M1 to M8. After a first iteration I1 of the clustering algorithm described in FIG. 5, it is found e.g. that M1 and M2 are the closest, with a distance under the threshold value. Accordingly, M1 and M2 are grouped as a cluster. M1 is denoted e.g. as a reference channel. In a second iteration I2, M5 and M6 are closest, with a distance under the threshold value. They are grouped as a further cluster and with e.g. M5 as a reference channel. In a third iteration I3, M1 and M3 are closest, with a distance under the threshold value. M1, M2 and M3 are grouped in a cluster with e.g. M1 as a reference channel. In a fourth iteration I4, M1 and M5 are closest, with a distance under the threshold value. They are clustered with e.g. M1 as a reference channel. In a fifth iteration I5, M7 and M8 are closest, with a distance under the threshold value. They are clustered with e.g. M7 as a reference channel. In a sixth iteration I6, there are the reference channels M1, M4 and M7. The distances from one another are above the threshold value and therefore no further grouping is effected. The clustering algorithm thus groups the 8 channels M1 to M8 into 3 clusters C1, C2, C3.

Figure 6:
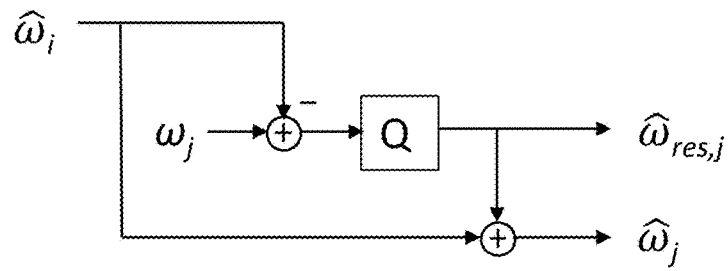
FIG. 6 shows a schematic view of the sequence of residual encoding according to one embodiment of the invention.

FIG. 6 shows a schematic view of the sequence of encoding of the secondary channels (also denoted as residual channels) according to one embodiment of the invention. As already explained in the foregoing, the encoding of a signal channel is effected by the quantizing of its wavelet coefficients. The quantizing of the wavelet coefficients of a reference channel i is performed by the reference encoding module 7. FIG. 6 shows how the quantized wavelet coefficients of the reference channel i are subtracted from the wavelet coefficient of the residual channel j. The subtracted wavelet coefficients are quantized by the quantizing unit embedded in the residual encoding module 8. Moreover, FIG. 6 shows how the quantized values of the wavelet coefficients can be re-established by the addition of the quantized wavelet coefficients of the reference channel and the quantized, subtracted wavelet coefficients of the residual channel. This information is relevant for the decoding, in particular for the dequantizing.

Figure 7:
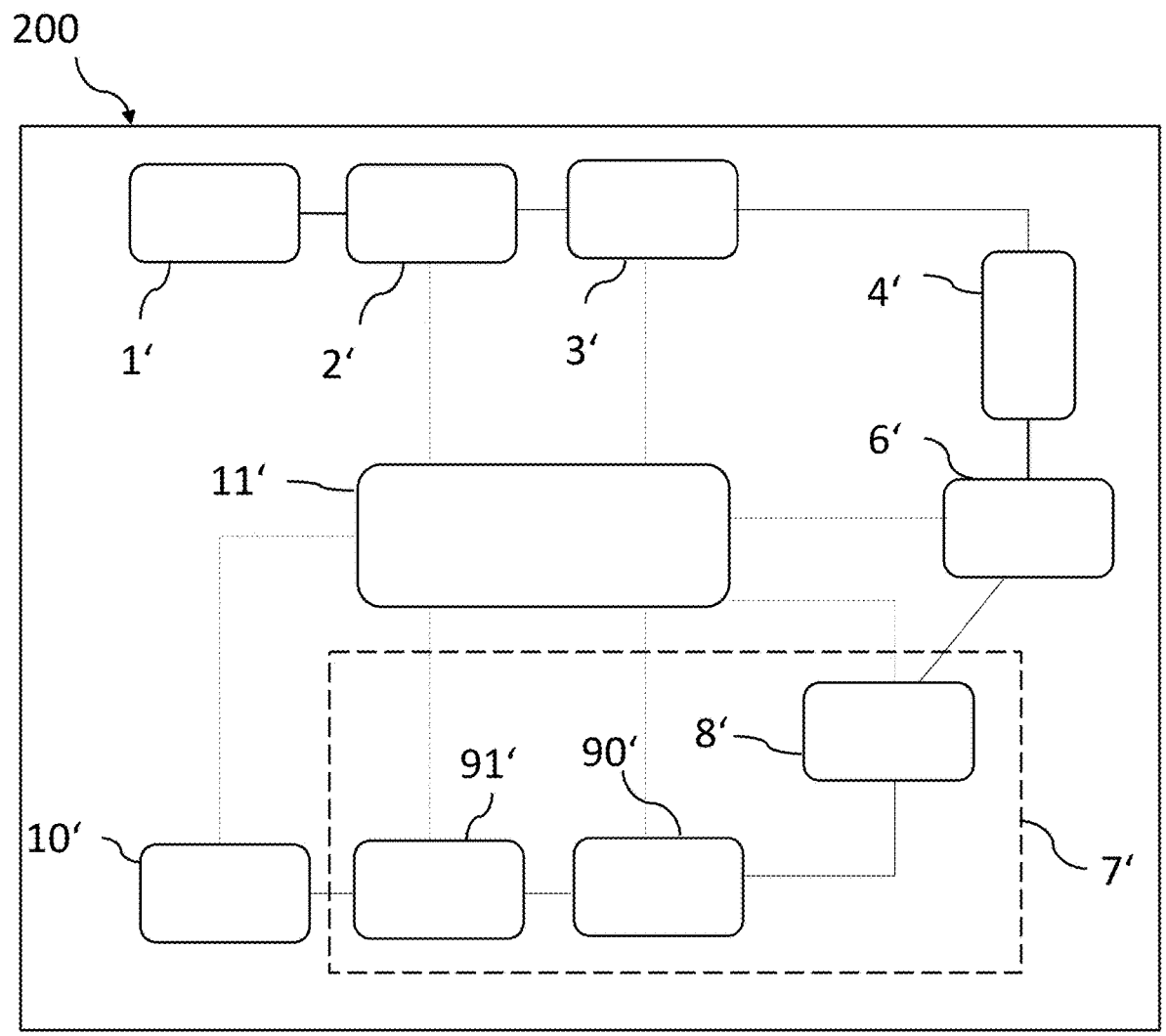
FIG. 7 shows a decoding device for decoding at least one signal, which is collected by a tactile sensor, from a bit stream according to one embodiment of the invention.

FIG. 7 shows a decoding device 200 for decoding a vibrotactile signal, which is collected by a touch sensor from a bit stream, according to one embodiment of the invention. The decoding device 200 comprises a decoder input module 10', a decoding module 7', a declustering module 6', an inverse discrete transform unit 4', a decoder output module 1' and a header decoding unit 11'.

The decoder input module 10' is configured to receive and demultiplex a (multiplex) bit stream. Secondary information is output to the header decoding unit 11', while the encoded signals are sent for decoding. The decoding module 7' is designed to decompress and dequantize the bit stream. To this end, the decoding module 7' comprises an inverse SPIHT (ISPIHT) unit 90' with an inverse AC unit 91' and a differential decoding unit 8' which is configured to decode the clustered channels of a cluster in relation to a reference channel. The declustering module 6' is designed to degroup the channels within each cluster and to determine the corresponding wavelet coefficients. The inverse, discrete wavelet transform unit 4' is configured to re-establish the wavelet coefficients as signals.

The decoding device 200 further comprises a mean value decoding unit 3' and an inverse block module 2'. The mean value decoding unit 3' receives the secondary information (also denoted as additional information) of the header decoding unit 11' and thus calculates the adjusted mean value of the signal channels. The inverse block module 2' also uses the additional information in order then to illustrate the original signal channels, which were divided into blocks, as a unit. The decoder output module 1' is provided to output the decoded signal channels.

Figure 8:
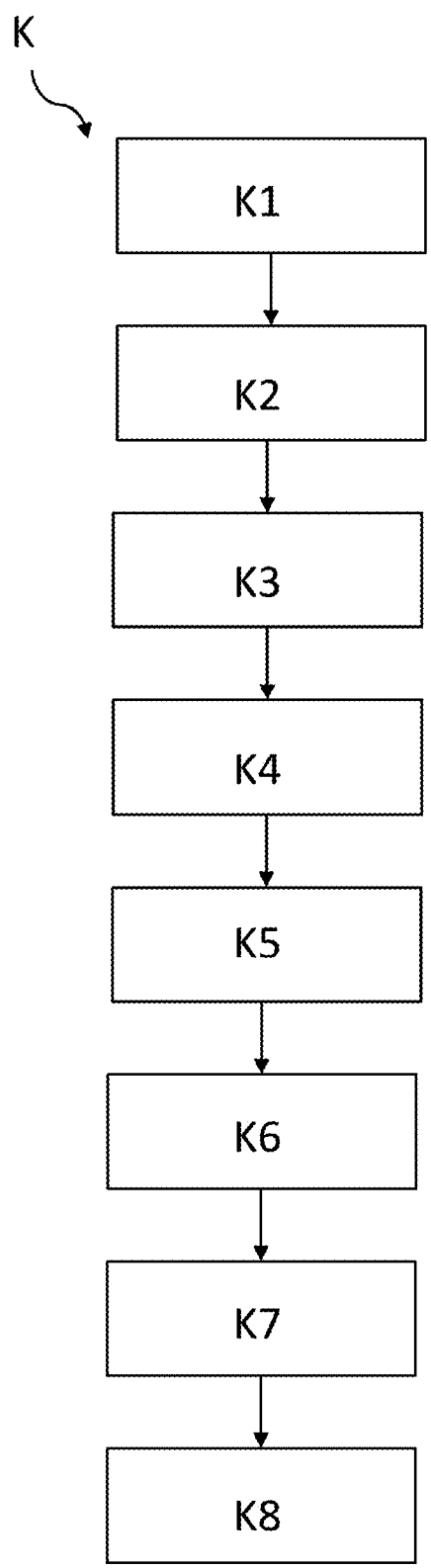
FIG. 8 shows a flow diagram of an encoding method for encoding a vibrotactile signal according to one embodiment of the invention.

FIG. 8 shows a flow diagram of an encoding method K for encoding a vibrotactile signal according to one embodiment of the invention. In a step K1, a multichannel signal is received. In a further step K2, a respective discrete wavelet transform is performed for each channel of the multichannel signal. In a further step K3, a frequency range representation of each channel is generated, e.g. by means of a discrete cosine transform. In experiments performed by the inventors, the discrete cosine transform was demonstrated to be particularly stable. In a further step K4, a psychohaptic model is used. The model serves to model human perception of the multichannel signal in order to add haptic elements in the encoding. For this purpose, the model uses the frequency range representation.

In a further step K5, the channels are grouped into clusters. This is effected, as already described in FIG. 4 and FIG. 5, by means of a clustering algorithm which uses a psychohaptic metric or perception metric based upon the psychohaptic model. Each cluster is allocated a reference channel, while other channels remain as secondary channels. In a further step K6, the wavelet coefficients of the reference channels are quantized and encoded. In a step K7, the secondary channels are quantized and differential-encoded (see e.g. FIG. 6 and the associated description). In a further step K8, the clustered, compressed channels are output as a bit stream. As already explained in the foregoing, the bit stream contains not only the encoded signals but also secondary information which is required for the decoding of the clustered signals.

Figure 9:
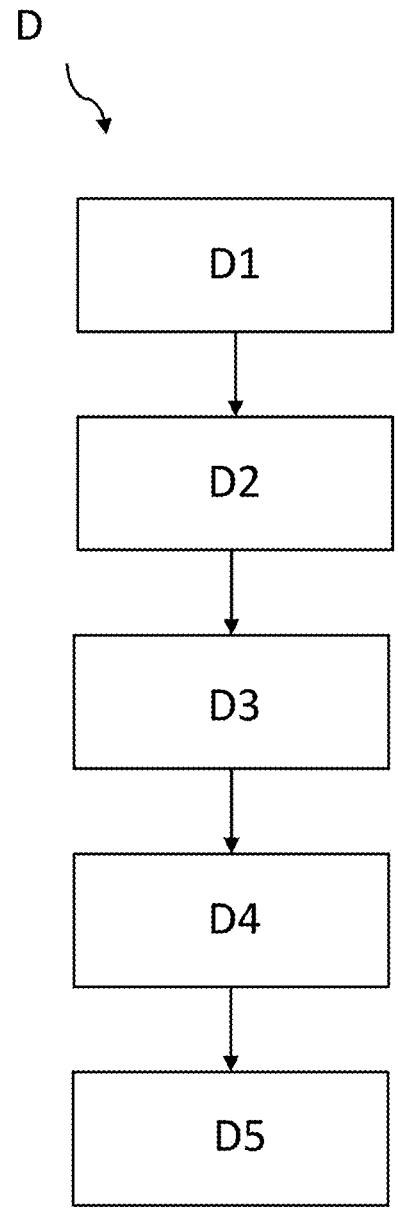
FIG. 9 shows a flow diagram of an exemplary decoding method for decoding a vibrotactile signal from a bit stream.

FIG. 9 shows a flow diagram of an exemplary decoding method D for decoding a vibrotactile signal from a bit stream. In a step D1, a (multiplexing) bit stream of clustered, vibrotactile multichannel signals is received. In a further step D2, the bit stream is decoded and dequantized, wherein the clustered channels of a cluster are decoded in relation to the reference channel by means of differential-decoding. In a further step D3, the channels within a decoded cluster are degrouped, wherein the channels are determined as wavelet coefficients based thereon. In a further step D4, an inverse, discrete wavelet transform is executed, wherein the original channel is generated from the wavelet coefficients of a channel. In a further step D5, the decoded multichannel signal is output. As already explained in the foregoing, the decoding method is independent of the psychohaptic model. Therefore, the method can be used for the decoding of bit streams which are generated with various psychohaptic models and various perception metrics.

The graphs in FIGS. 10 to 13 evidence the performance capability of the encoding device in accordance with the invention. For this purpose, two quality indices, specifically the signal-to-noise ratio (SNR) and the spectral-temporal similarity (ST-SIM), are calculated for various compression ratios (CR).

The SNR is an example of an objective performance number which in this case relates objectively to the absence of an association with subjective human perception. In order to assess the quality of the signal in the way a human would perceive it, so-called subjective performance numbers are introduced. In particular, the ST-SIM which combines spectral perception information with temporal similarity information has been shown to produce results which mimic human perception. The quality assessment of the test signals with ST-SIM should therefore resemble the quality assessment which humans would ascribe to the same test signals.

FIG. 10 to FIG. 13 show the results of a test which is performed. The test signals used were 25 vibrotactile recordings with in each case 8 channels. The signals were originally recorded at a sampling frequency of 10 Hz and then down-sampled to 2.5 Hz. The mean value of the signals across all channels was set to 0 beforehand and the amplitude was standardized in order to obtain a dynamic range between 0 and 1. The block length was set to between 32 and 1024. The bit budget of each block of a signal was set to between 4 and 135 bits. All signals were encoded, decoded and the resulting output was then compared to the original.

Figure 10:
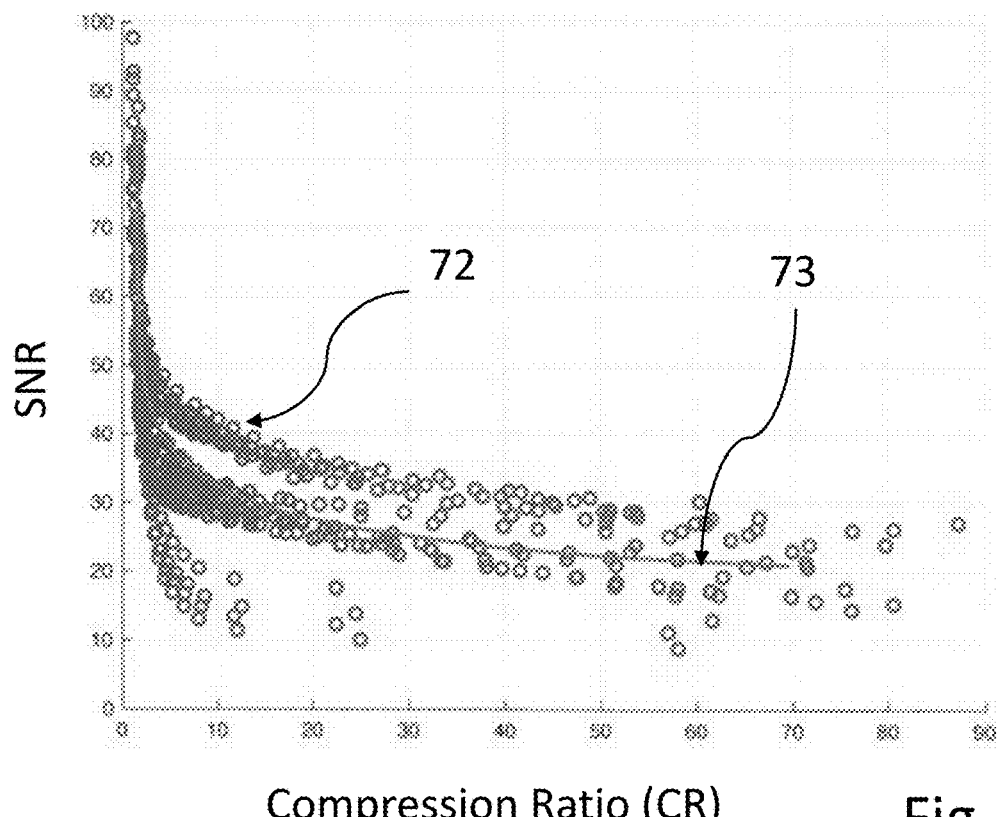
FIG. 10 shows the calculated signal-to-noise ratio (SNR) of test signals for various compression ratios (CR)

FIG. 10 shows the calculated signal-to-noise ratio (SNR) of the 200 vibrotactile test signals, which were encoded and decoded by the inventive encoding device 100 and decoding device 200 respectively, for various compression ratios (CR). The circles 72 illustrate the various results and the line 73 shows the average performance. The CR values are between a minimum value of 1.5 and a maximum value of 87. The average performance 73 of the SNR increases as the CR increases, from a minimum value of 27 (if the CR assumes its maximum value) to a maximum value of circa 98 (if the CR assumes its minimum value).

Figure 11:
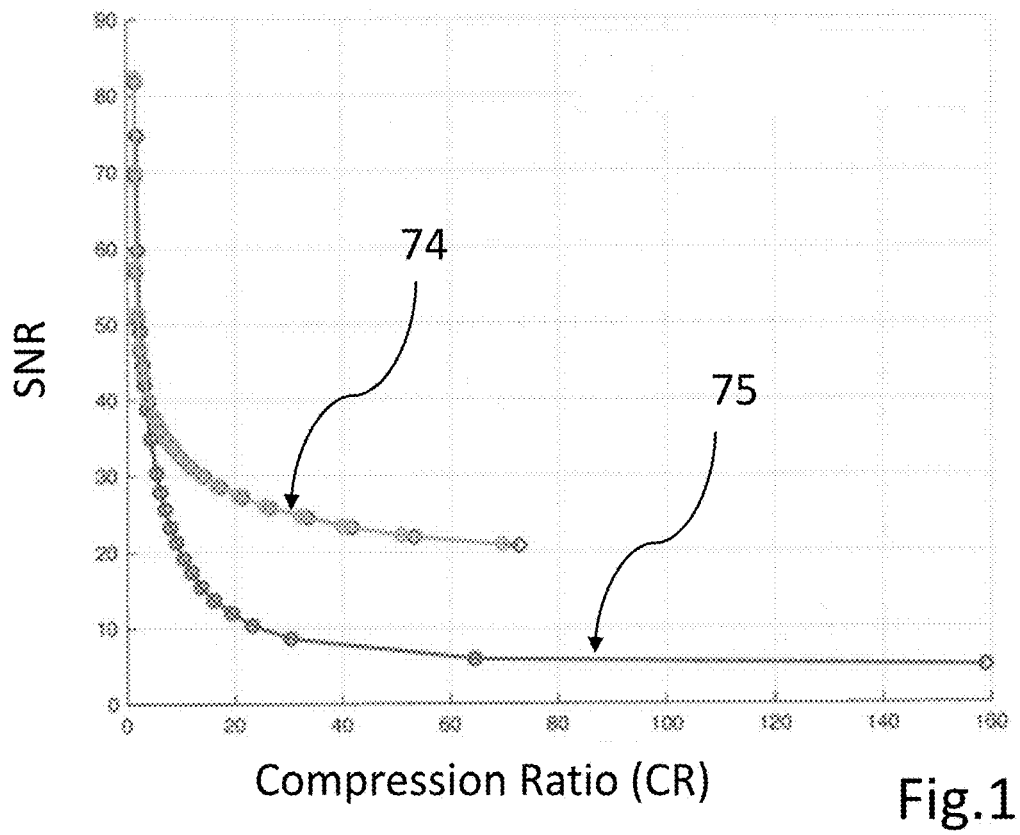
FIG. 11 compares the calculated signal-to-noise ratio (SNR) of the test signals for various compression ratios (CR) for encoding with and without clustering.

FIG. 11 compares the performance of the encoding device 100 in accordance with the invention and the decoding device 200 in accordance with the invention to an encoding device and decoding device according to the prior art, with the SNR being applied as the quality standard. FIG. 11 shows, on the one hand, the calculated signal-to-noise ratio (SNR) 74 of the 200 vibrotactile test signals, which have been encoded and decoded by the inventive encoding device 100 and decoding device 200, for various compression ratios (CR) and, on the other hand, the calculated signal-to-noise ratio (SNR) 75 of the 200 vibrotactile test signals, which have been encoded and decoded by a standard encoding device and a standard decoding device, for various compression ratios (CR). The inventive encoding device 100 and decoding device 200 improve the SNR versus CR ratio in comparison with the performance of the conventional encoding and decoding devices. For compression ratios starting from 20, the performance is improved by circa a factor of 3.

Figure 12:
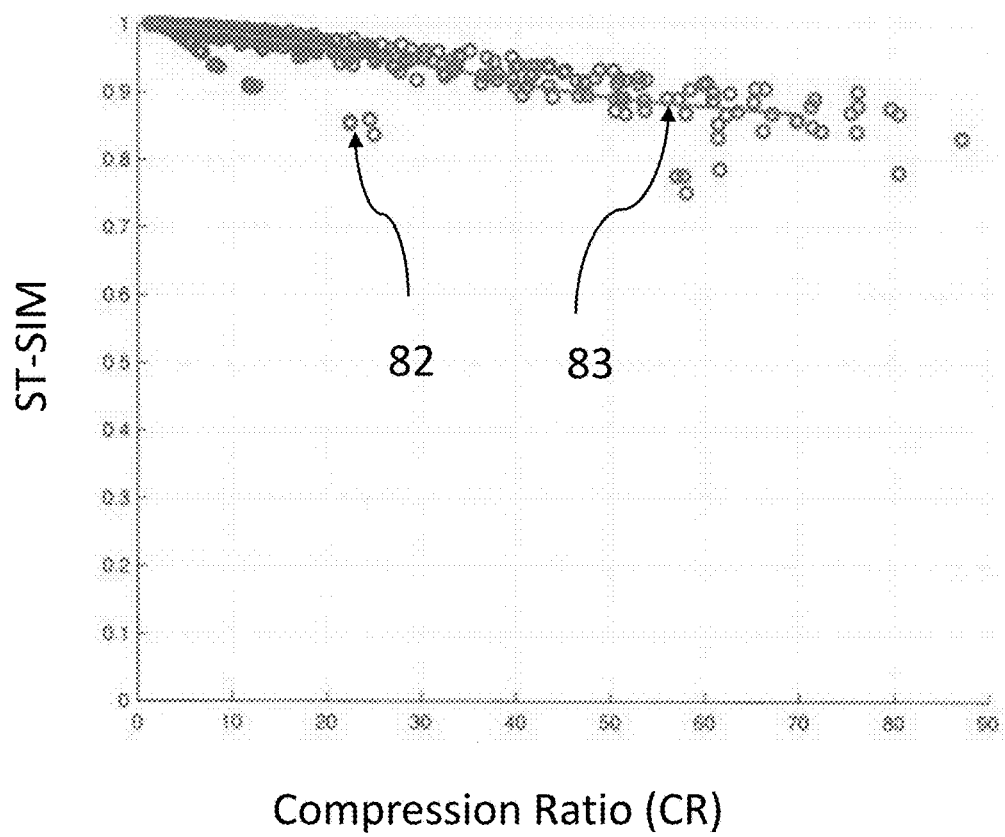
FIG. 12 shows the subjective similarity measure ST-SIM of the test signals with respect to the compression ratios (CR)

FIG. 12 shows the subjective similarity measure ST-SIM of the 200 test signals, which were encoded and decoded by the inventive encoding device 100 and decoding device 200, for various compression ratios. In comparison with the SNR illustrated in FIG. 11, FIG. 12 shows a higher quality of the signals. The performance of the codec of the present invention is over 70% for all test signals and remains relatively flat, or at least at a very gentle slope, for high compression ratios (e.g. up to 70). In other words, even if the signals are highly compressed, the loss of signal quality is very low.

Figure 13:
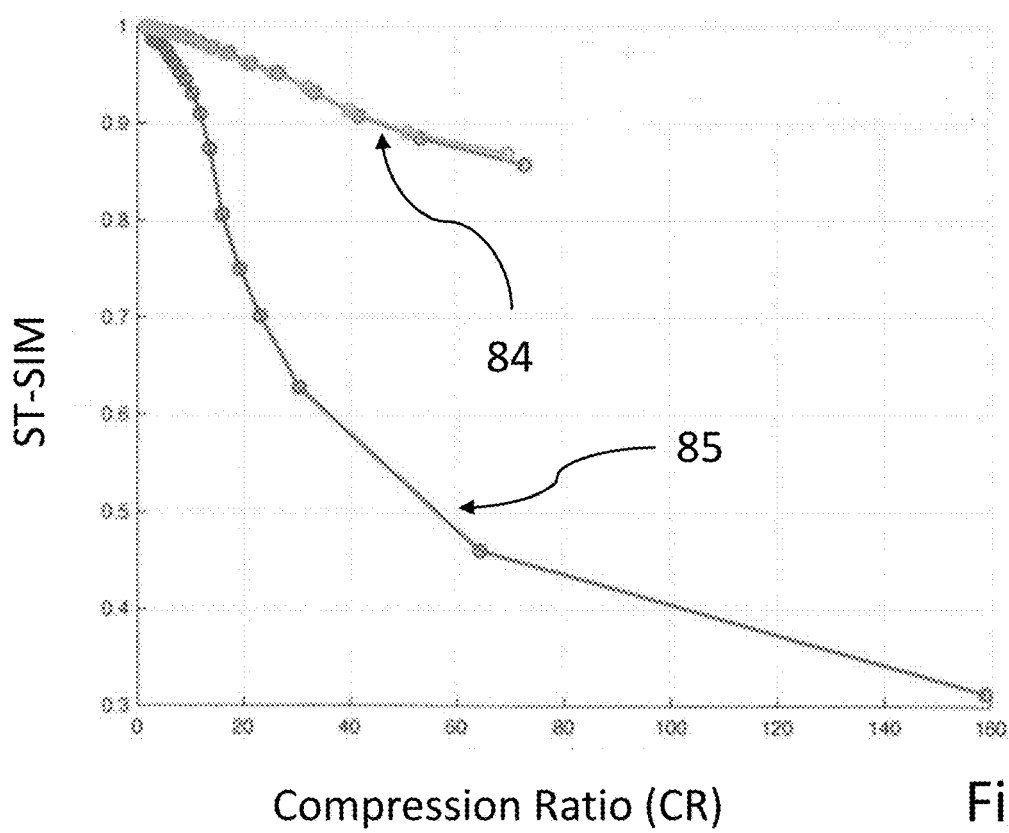
FIG. 13 compares the subjective similarity measure ST-SIM of the test signals with respect to the compression ratios (CR) for encoding with and without clustering.

FIG. 13 compares the performance of the encoding device 100 in accordance with the invention and the decoding device 200 in accordance with the invention to an encoding device and decoding device according to the prior art, with the ST-SIM being applied as the quality standard. FIG. 13 shows, on the one hand, the calculated ST-SIM 84 of the 200 vibrotactile test signals, which have been encoded and decoded by the inventive encoding device 100 and decoding device 200, for various compression ratios (CR) and, on the other hand, the calculated ST-SIM 85 of the 200 vibrotactile test signals, which have been encoded and decoded by a standard encoding device and a standard decoding device, for various compression ratios (CR). The inventive encoding device 100 and decoding device 200 demonstrate an excellent performance over the prior art. The introduction of a metric in the clustering algorithm which includes perception information helps to ensure that with the subjective, human-grade ST-SIM, the quality of the signals remains very high, even for high compression ratios.

Figure 14:
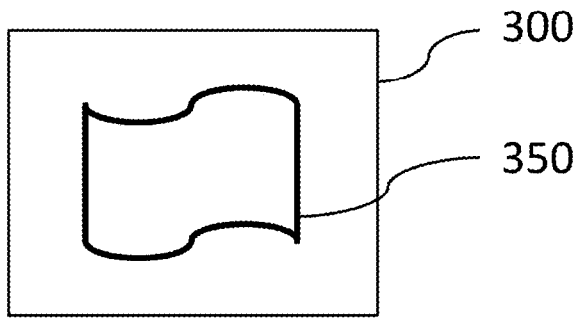
FIG. 14 is a schematic block diagram which illustrates a computer program product according to one embodiment of the fifth aspect of the present invention.

FIG. 14 shows a schematic block diagram which illustrates a computer program product 300 according to one embodiment of the third aspect of the present invention. The computer program product 300 comprises an executable program code 350 which is configured such that, upon execution thereof, it performs the method according to any embodiment of the second aspect of the present invention, in particular as described in the preceding figures.

Figure 15:
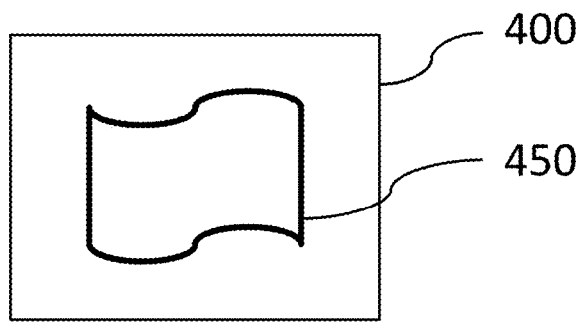
FIG. 15 is a schematic block diagram which illustrates a computer program product according to one embodiment of the sixth aspect of the present invention.

FIG. 15 shows a schematic block diagram which illustrates a computer program product 400 according to one embodiment of the third aspect of the present invention. The computer program product 400 comprises an executable program code 450 which is configured such that, upon execution thereof, it performs the method according to any embodiment of the fourth aspect of the present invention, in particular as described in the preceding figures.

Figure 16:
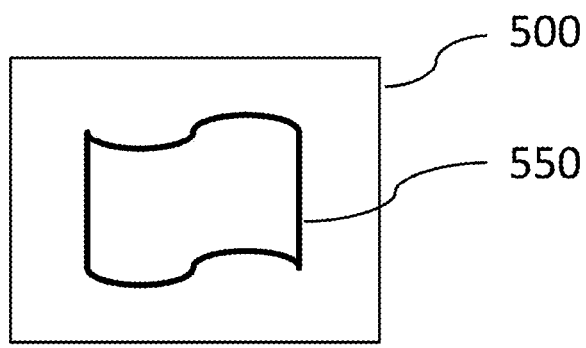
FIG. 16 is a schematic block diagram which illustrates a non-volatile computer-readable data storage medium according to one embodiment of the seventh aspect of the present invention.

FIG. 16 shows a schematic block diagram which illustrates a non-volatile computer-readable data storage medium 500 according to one embodiment of the fourth aspect of the present invention. The data storage medium 500 comprises an executable program code 550 which is configured such that, when executed, it performs the method according to any embodiment of the second aspect of the present invention, in particular as described in relation to the preceding figures.

Figure 17:
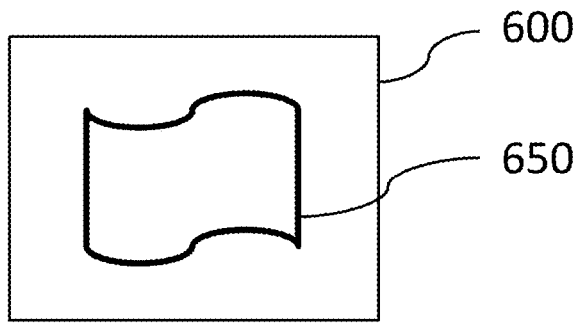
FIG. 17 is a schematic block diagram which illustrates a non-volatile computer-readable data storage medium according to one embodiment of the eighth aspect of the present invention.

FIG. 17 shows a schematic block diagram which illustrates a non-volatile computer-readable data storage medium 600 according to one embodiment of the fourth aspect of the present invention. The data storage medium 600 comprises an executable program code 650 which is configured such that, when executed, it performs the method according to any embodiment of the fourth aspect of the present invention, in particular as described in relation to the preceding figures.

The non-volatile computer-readable data storage medium can comprise or consist of any type of computer memory, in particular a semiconductor memory, such as a solid-state memory. The data storage medium can also comprise or consist of a CD, DVD, Blu-ray disc, USB memory stick, or the like.

The invention claimed is:

1. An encoding device for encoding vibrotactile multichannel signals, comprising:
 (a) an encoder input module which is configured to receive a multichannel signal;
 (b) a transform module which is adapted to execute in each case a discrete wavelet transform of each channel of the multichannel signal and to generate a respective frequency range representation of each channel;
 (c) a psychohaptic model unit which is configured to allocate to each channel, based on the respective frequency range representation, a mathematical representation of human perception of the channel;
 (d) a clustering module which is configured to group, based on the allocated mathematical representation of human perception of each channel and a similarity measure of the channels, the wavelet-transformed channels of each multichannel signal into clusters, wherein each cluster is allocated a reference channel;
 (e) a reference encoding module which is configured to quantize and compress wavelet coefficients of the reference channels which result from the performed discrete wavelet transform of the reference channels;
 (f) a differential encoding module which is configured to encode the channels within a cluster, which are not a reference channel, in relation to the reference channel or at least one other channel of the cluster; and (g) an encoder output module which outputs the clustered, compressed channels of each multichannel signal as a bit stream.

2. The encoding device as claimed in claim 1, further comprising a block division module which is configured to divide each channel into a plurality of consecutive blocks.

3. The encoding device as claimed in claim 2, wherein the block division module comprises a block switch unit which is configured to select the length of the blocks.

4. The encoding device as claimed in claim 3, wherein the block division module comprises a transient recognition unit which is configured to fix the length of the blocks and to communicate this length to the block switch unit.

5. The encoding device as claimed in claim 1, wherein the psychohaptic model unit is provided to generate the mathematical representation of human perception of a channel as a frequency-dependent function, based on a perception threshold and on a masking threshold function which is based on the frequency peaks of the channel.

6. The encoding device as claimed in claim 1, wherein the clustering module is configured to perform the clustering of channels iteratively, wherein for each channel in a cluster there is at least one other channel in the cluster, with respect to which the similarity measure is below a predetermined threshold value.

7. The encoding device as claimed in claim 1, wherein the similarity measure of two channels is proportional to an energy difference value of the channels.

8. The encoding device as claimed in claim 7, wherein the energy difference value of the channels is calculated on the basis of the wavelet coefficients of the channels.

9. The encoding device as claimed in claim 5, wherein the similarity measure of two channels is proportional to the product of the energies of the channels and/or inversely proportional to the product of the energies of the masking threshold functions of the channels.

10. The encoding device as claimed in claim 1, further comprising a header encoding unit which is adapted to add secondary information to the bit stream of the encoded multichannel signal.

11. The encoding device as claimed in claim 10, further comprising a mean value encoding unit which is configured to generate a zero mean value channel from a channel by subtracting the mean value, and to transmit information regarding the mean value as secondary information to the header encoding unit.

12. A decoding device for decoding a bit stream of clustered vibrotactile multichannel signals, comprising:
(a) a decoder input module which is configured to receive a bit stream of clustered vibrotactile multichannel signals;
(b) a decoding module which is configured to decompress and dequantize the bit stream, further comprising a differential decoding unit which is configured to decode the clustered channels of a cluster in relation to a reference channel;
(c) a declustering module which is configured to degroup the channels within a decoded cluster and to determine wavelet coefficients based thereon;
(d) an inverse discrete wavelet transform unit which is configured to generate the original channel from the wavelet coefficients of a channel; and
(e) a decoder output module which is configured to output a decoded multichannel signal based on the decoded channels.

13. A decoding method for encoding vibrotactile multichannel signals, comprising the steps of:
(a) receiving a multichannel signal;
(b) executing a respective discrete wavelet transform of each channel of the multichannel signal;
(c) generating a respective frequency range representation of each channel;
(d) allocating, based on the frequency range representation of each channel and on a psychohaptic model, each channel to a respective mathematical representation of human perception of the channel;
(e) grouping, based on the allocated mathematical representation of human perception of each channel and on a similarity measure of the channels, the wavelet-transformed channels of each multichannel signal into clusters, wherein each cluster is allocated a reference channel;
(f) quantizing and encoding the wavelet coefficients of the reference channels which result from the performed discrete wavelet transform of the reference channels;
(g) quantizing and differential-encoding the channels within a cluster, which are not a reference channel, in relation to the reference channel or at least one other channel of the cluster; and
(h) outputting the clustered, compressed channels of each multichannel signal as a respective bit stream.

14. A decoding method for decoding a bit stream of clustered vibrotactile multichannel signals, comprising the steps of:
(a) receiving a bit stream of clustered vibrotactile multichannel signals;
(b) decoding and dequantizing the bit stream, wherein, by means of differential-decoding, the clustered channels of a cluster are decoded in relation to a reference channel;
(c) declustering the channels within a decoded cluster, wherein the channels are expressed as wavelet coefficients based thereon;
(d) executing an inverse discrete wavelet transform, wherein the original channel is generated from the wavelet coefficients of a channel; and
(e) outputting a decoded multichannel signal based on the decoded channels.

15. System A system for transmitting vibrotactile signal channels, comprising:
an encoding device including;
(a) an encoder input module which is configured to receive a multichannel signal;
(b) a transform module which is adapted to execute in each case a discrete wavelet transform of each channel of the multichannel signal and to generate a respective frequency range representation of each channel;
(c) a psychohaptic model unit which is configured to allocate to each channel, based on the respective frequency range representation, a mathematical representation of human perception of the channel;
(d) a clustering module which is configured to group, based on the allocated mathematical representation of human perception of each channel and a similarity measure of the channels, the wavelet-transformed channels of each multichannel signal into clusters, wherein each cluster is allocated a reference channel;
(e) a reference encoding module which is configured to quantize and compress wavelet coefficients of the reference channels which result from the performed discrete wavelet transform of the reference channels;
(f) a differential encoding module which is configured to encode the channels within a cluster, which are not a reference channel, in relation to the reference channel or at least one other channel of the cluster; and (g) an encoder output module which outputs the clustered, compressed channels of each multichannel signal as a bit stream; and a decoding device including;

(a) a decoder input module which is configured to receive a bit stream of clustered vibrotactile multichannel signals;

(b) a decoding module which is configured to decompress and dequantize the bit stream, further comprising a differential decoding unit which is configured to decode the clustered channels of a cluster in relation to a reference channel;

(c) a declustering module which is configured to degroup the channels within a decoded cluster and to determine wavelet coefficients based thereon;

(d) an inverse discrete wavelet transform unit which is configured to generate the original channel from the wavelet coefficients of a channel; and (e) a decoder output module which is configured to output a decoded multichannel signal based on the decoded channels, wherein the decoding device is configured to decode a vibrotactile signal which has been encoded with the encoding device.

16. The encoding device as claimed in claim 6, wherein the similarity measure of two channels is proportional to the product of the energies of the channels and/or inversely proportional to the product of the energies of the masking threshold functions of the channels.

* * * * *